(12) United States Patent
Kemmochi et al.

(10) Patent No.: US 7,405,499 B2
(45) Date of Patent: Jul. 29, 2008

(54) WAVEFORM GENERATING APPARATUS, WAVEFORM GENERATING METHOD, AND DECODER

(75) Inventors: Chisato Kemmochi, Kanagawa (JP); Akira Inoue, Tokyo (JP); Masayuki Nishiguchi, Kanagawa (JP)

(73) Assignee: Sony Corporation (JP)

( * ) Notice: Subject to any disclaimer, the term of this patent is extended or adjusted under 35 U.S.C. 154(b) by 486 days.

(21) Appl. No.: 10/516,819

(22) PCT Filed: Jun. 27, 2003

(86) PCT No.: PCT/JP03/08228

§ 371 (c)(1),
(2), (4) Date: Jun. 8, 2005

(87) PCT Pub. No.: WO2004/006425

PCT Pub. Date: Jan. 15, 2004

(65) Prior Publication Data

US 2005/0251709 A1    Nov. 10, 2005

(30) Foreign Application Priority Data

Jul. 8, 2002    (JP) .............................. 2002-199070

(51) Int. Cl.
*H03K 3/00* (2006.01)
(52) U.S. Cl. ..................................... 307/106
(58) Field of Classification Search .................. 307/106
See application file for complete search history.

(56) References Cited

U.S. PATENT DOCUMENTS 4,860,238 A * 8/1989 Kraker ....................... 708/276

FOREIGN PATENT DOCUMENTS

| EP | 1 099 998 A2 | 5/2001 |
| JP | 58-050802 | 3/1983 |
| JP | 01-278104 | 11/1989 |
| JP | 10-171462 | 6/1998 |
| JP | 2000-347678 | 12/2000 |
| JP | 2002-111503 | 4/2002 |

OTHER PUBLICATIONS

International Search Report dated Aug. 5, 2003.
European Search Report Feb. 23, 2006.
Japanese Office Action; Application No. 2002-199070, dated Mar. 27, 2007.

* cited by examiner

*Primary Examiner*—Robert L. Deberadinis
(74) *Attorney, Agent, or Firm*—Rader Fishman & Grauer PLLC; Ronald P. Kananen

(57) ABSTRACT

Amplitude, phase and frequency of a sine wave to be generated are calculated on the basis of feature quantity s1 delivered to feature quantity detecting means (2), and are sent to initialization means (3). The initialization means (3) calculates first two points of the sine wave to send the points thus calculated to oscillator (sine wave generating means) (4) as initial value s4. The oscillator (4) sequentially calculates values of respective sample points of waveform by using recurrence formula in accordance with initial value or values instructed from the initialization means (3) to thereby generate a sine wave signal. Thus, sine wave generation is performed without performing modulo-addressing.

17 Claims, 14 Drawing Sheets

WAVEFORM GENERATING APPARATUS, WAVEFORM GENERATING METHOD, AND DECODER

TECHNICAL FIELD

The present invention relates to a waveform generating apparatus, a waveform generating method, and a decoder which are adapted for generating waveform such as sine wave signal, etc., and relates to, e.g., a waveform generating apparatus, a waveform generating method, and a decoder which are adapted for generating periodical waveform such as sine wave, etc. without performing modulo-addressing for reading out sine wave table.

This Application claims priority of Japanese Patent Application No. 2002-199070, filed on Jul. 8, 2002, the entirety of which is incorporated by reference herein.

BACKGROUND ART

Technologies for digitally generating waveform such as since wave, etc. have been used in various fields such as signal encoding and/or signal synthesis, etc. For example, as a technology in which feature quantity for determining sine wave is periodically given to generate a sine wave having predetermined number of samples $N_1$, there is known a method in which a table where crest (peak) values of sine wave are stored is prepared in advance to read the table while performing modulo-addressing on the basis of the feature quantity by using DSP (Digital Signal Processor) to perform amplitude correction.

A conventional configuration example of an apparatus adapted for generating a sine wave periodically varying will be explained below with reference to the attached drawings. FIG. 1 is a block diagram of the conventional sine wave generating apparatus, and FIG. 2 is an example of flowchart for explaining the operation of the sine wave generating apparatus.

In FIG. 1, feature quantity s101 periodically varying is taken in by input means 101, and is delivered to feature quantity detecting means 102. At the feature quantity detecting means 102, as shown at step S11 of FIG. 2, sine wave table read-in method feature quantity s102 and sine wave amplitude correction quantity s103 are calculated on the basis of the delivered feature quantity. For example, with respect to the read-in method feature quantity s102, read-in start point and how to read in the table every points are calculated by relationship of $\Omega_1$, $\Omega_2$ and $\Phi$. Similarly, the amplitude correction quantity s103 is also calculated by ratio between $A_1$ and $A_2$. The read-in method feature quantity calculated at the feature quantity detecting means 102 is "shift of phase" and/or "relationship of frequency", etc. between sine wave and sine wave table which are generated.

Read-in method feature quantity s2 which has been calculated at feature quantity detecting means 102 is sent to read-in position calculating means 103 so that sine wave table read-in start position is instructed. The sine wave table read-in start position thus instructed is sent to sine wave table read-in means 104 as sine wave table read-in position signal s104 by read-in position calculating means 103. As shown at step S12, values are read in from the sine wave table.

The value which has been read in (read-in signal s105) from the sine wave table is delivered to sine wave amplitude correction means 105. At step S13, the sine wave amplitude correction means 105 corrects amplitude of sine wave to be outputted by read-in signal s105 delivered from sine wave table read-in means 4 and sine wave amplitude correction quantity s103 instructed from feature quantity detecting means 102. In addition, at step S14, sine wave signal thus obtained is stored.

At step S15, whether or not read-in processing of all data to be processed is completed is discriminated. When the discrimination result is NO, processing proceeds to step S16 to update read-in position (readIndex) thereafter to return to the step S12.

Here, updating of the read-in position (readIndex) is performed by modulo-adding read-in position updating quantity (readInc) instructed by feature quantity detecting means 102 to read-in position signal s104 (readIndex) prior by one time point to calculate new read-in position signal s104 (readIndex). When read-in position maximum value of the sine wave table is indexMax, the readIndex is represented by the following formula.

$$\text{readIndex}=(\text{readIndex}+\text{readInc})\ \%\ \text{indexMax} \tag{1}$$

In the above formula, a % b indicates remainder when a is divided by b. New read-in position (readIndex) thus updated is delivered to read-in position calculating means 103. Namely, the read-in position signal s104 is calculated by read-in position signal s104 prior by one time point, read-in updating quantity and the number of samples N1 of the sine wave table.

Returning to FIG. 2, operations from the steps S12 to S14 are repeatedly performed until the number of samples N2 of output sine wave is prepared, i.e., until discrimination is made as YES (read-in processing of all data has been completed). At the time point when the number of output samples is prepared, a sine wave signal is delivered to output means 6.

Meanwhile, in the case where sine wave is generated by method as described above, it is necessary to perform modulo-addressing in order to perform read-in processing of table, i.e., to perform modulo operation for address calculation. However, DSPs (Digital Signal Processors) of various specifications are provided. There also exist digital signal processors in which there is restriction in performing modulo-addressing. There are also many cases where even digital signal processors in which there is restriction in performing such modulo-addressing may be employed because other functions are excellent.

For example, there are many instances where sine wave generating apparatus as described above is used at decoder for audio signal, etc. In many cases, the DSP is used for the entirety of decode processing rather than it is used only for sine wave generation. In the case where, e.g., processing ability of high sum of product operation is required in such decoder, it is sufficiently conceivable that DSP excellent in sum of product operation ability may be employed, even if it has restriction in ability of, e.g., modulo-addressing.

In such case, it is required to perform sine wave generation without performing modulo-addressing.

DISCLOSURE OF THE INVENTION

The present invention has been proposed in view of actual circumstances as described above, and an object of the present invention is to provide a waveform generating apparatus and a waveform generating method in which in the case where, e.g., feature quantity which periodically determines periodical waveform such as sine wave, etc. is given at a digital audio signal processor, etc., generation of periodical waveform such as sine wave, etc. can be performed without performing modulo-addressing in making reference to sine wave table, and a decoder to which such waveform generation is applied.

In the waveform generating apparatus and the waveform generating method according to the present invention, in order to solve the above-described problems, in generating periodical waveform on the basis of inputted feature quantity, the inputted feature quantity is detected to compute recurrence formula with at least two sample points being as initial value on the basis of the detected feature quantity to thereby generate the periodical waveform to output the generated periodical waveform.

Here, it is mentioned that the above-mentioned periodical waveform is a sine wave, and when value of a sine wave signal at an arbitrary time point of n is $y_{[n]}$ and phase $\Phi$ and frequency $\Omega_2$ of output sine wave are given as the feature quantity, $$y_{[0]} = A \sin(\Phi)$$

$$y_{[1]} = A \sin(\Omega_2 + \Phi)$$

are used as initial values $y_{[0]}$, $y_{[1]}$, and a formula in which value $Y_{[n+2]}$ of a sine wave signal at a time point of n+2 expressed below by value $Y_{[n+1]}$ of a sine wave signal at a time point of n+1 and value $Y_{[n]}$ of a sine wave signal at a time point of n $$y_{[n+2]} + 2 \times A \cos(\Omega_2) \times y_{[n+1]} - y_{[n]}$$

is used as the above-mentioned recurrence formula.

Moreover, it is mentioned that, in waveform generation applied to sine wave synthesis of a decoder supplied with encoded data including feature quantity obtained by performing sine wave analysis of time series signal every encoding frame, the feature quantity is periodically given every the encoding frame to store, by the one frame, the generated sine wave signal with respect to storage means to output the stored sine wave signal through the output means.

Further, the decoder according to the present invention is directed to a decoder supplied with encoded data including feature quantity obtained by performing sine wave analysis of time series signal every encoding frame, wherein the decoder includes waveform synthesis unit comprising separating means for separating feature quantity in the encoded data, detecting means for detecting the separated feature quantity, oscillating means for computing recurrence formula with at least two sample points being as initial values on the basis of the feature quantity detected by the detecting means to thereby generate the periodical waveform, and output means for outputting the periodical waveform generated from the oscillating means.

Here, in accordance with the present invention, in generating sine wave in which feature quantity for determining sine wave is periodically changed, feature quantity is taken thereinto to detect the feature quantity which has been taken thereinto to generate a sine waveform signal by using the detected feature quantity of sine wave and oscillator (sine wave generating means) with the feature quantity being as initial setting to store the generated sine wave signal to output the stored sine wave.

BEST MODE FOR CARRYING OUT THE INVENTION

Preferred embodiments according to the present invention will now be described with reference to the attached drawings.

Figure 1:
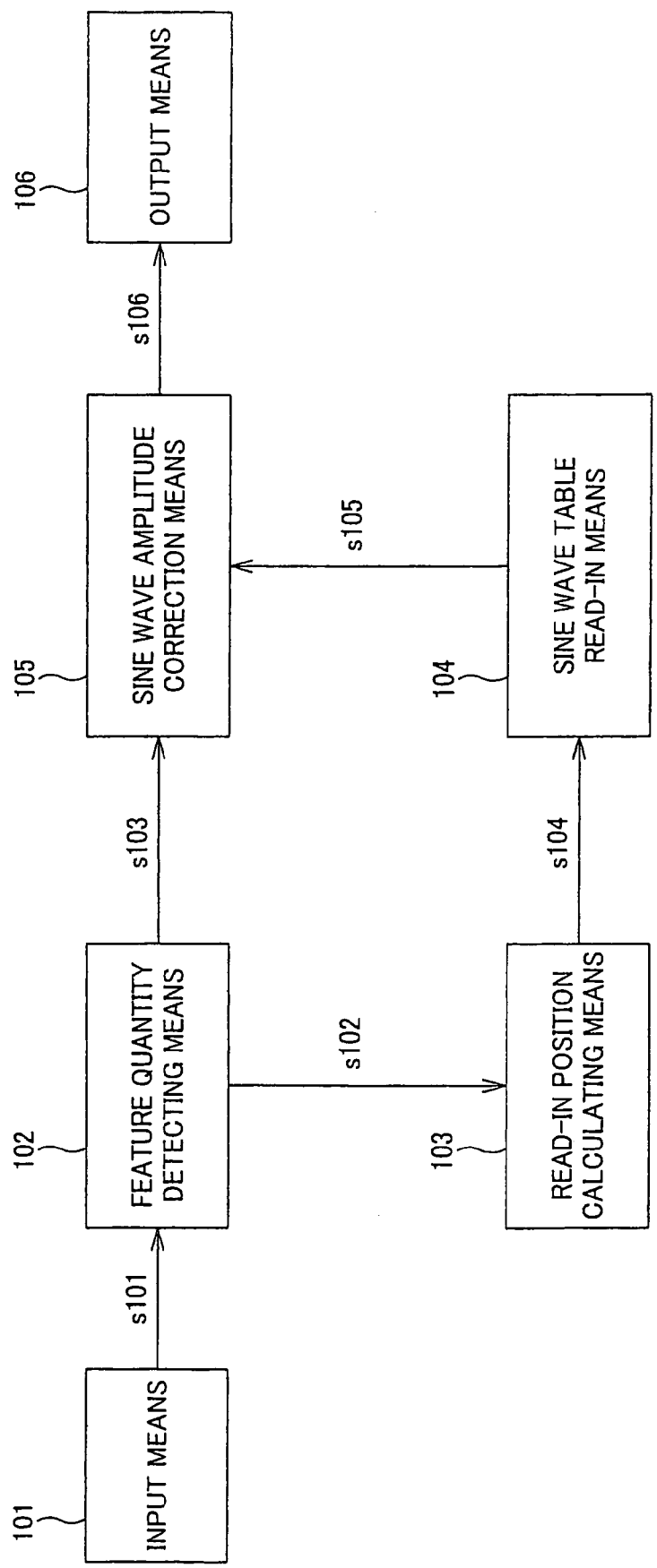
FIG. 1 is a block diagram showing a configuration example of a conventional sine wave generating apparatus.
Figure 2:
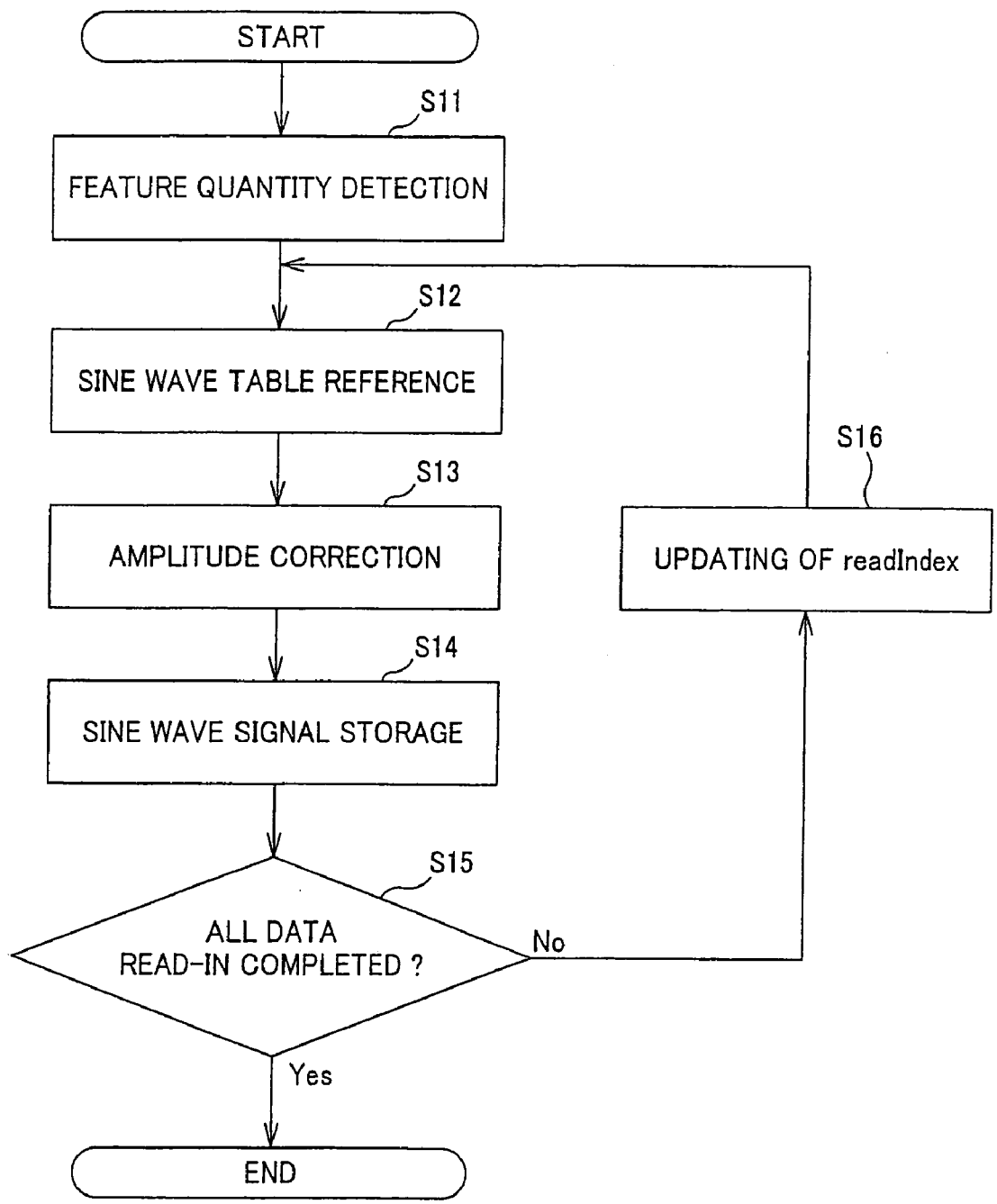
FIG. 2 is a flowchart for explaining the operation of the conventional sine wave generating apparatus.
Figure 3:
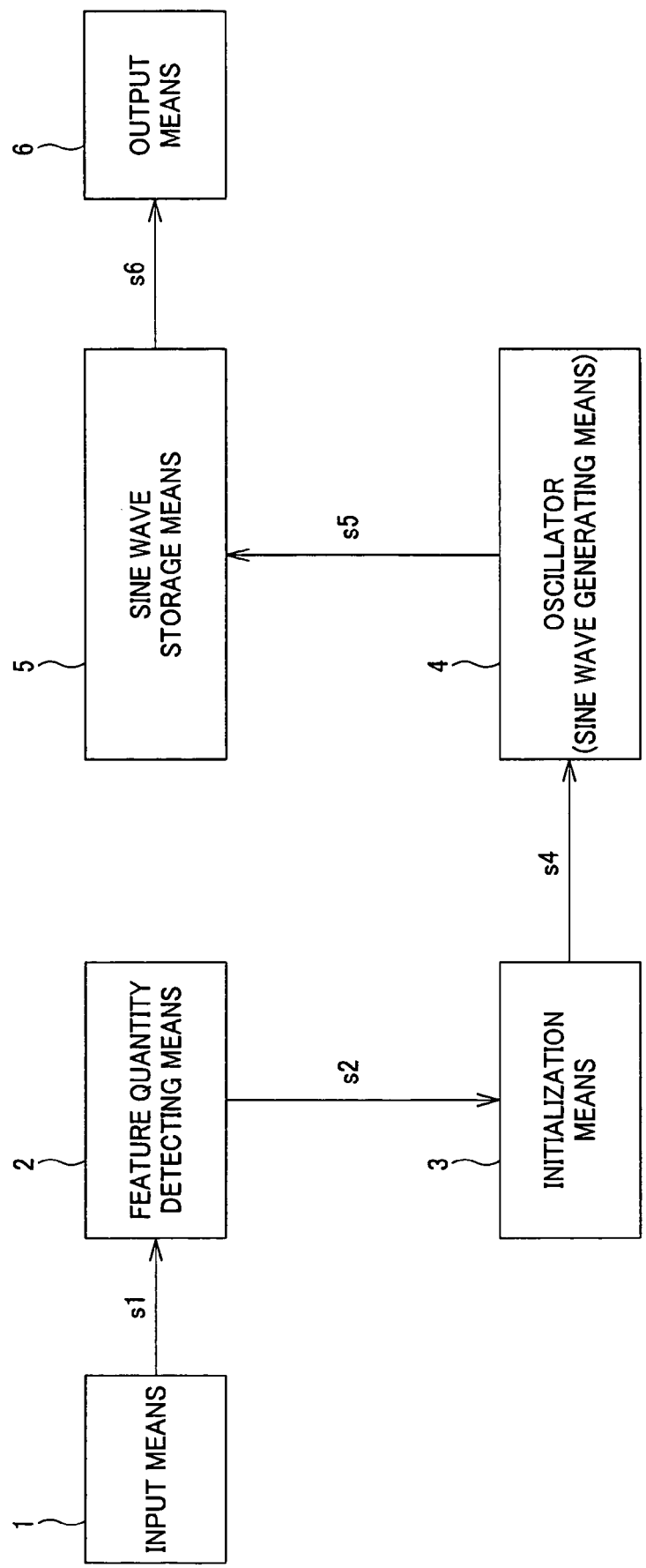
FIG. 3 is a block diagram showing outline of the configuration of a sine wave generating apparatus which is a first embodiment of the present invention.
Figure 4:
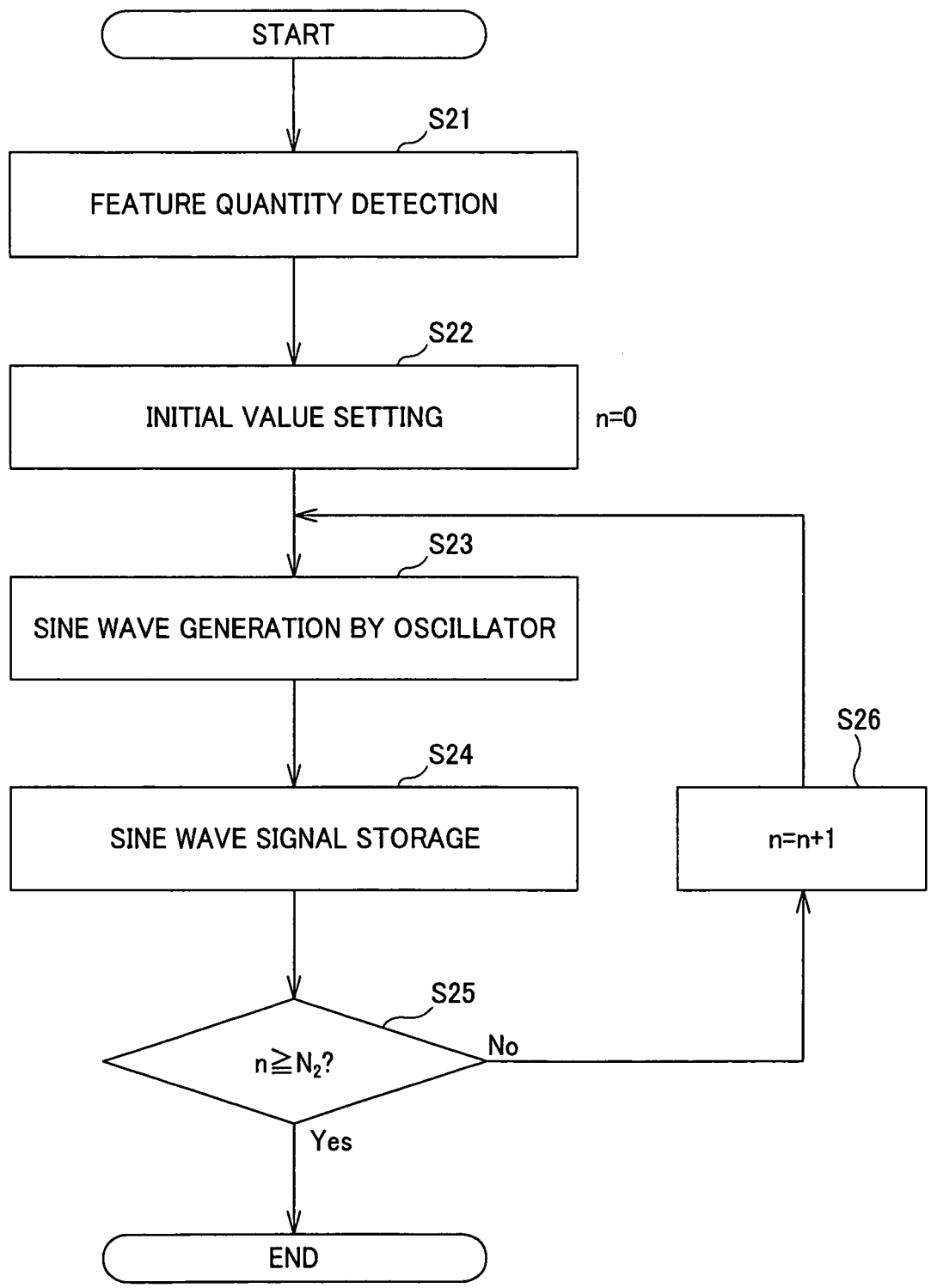
FIG. 4 is a flowchart for explaining the operation of the first embodiment of the present invention.

FIG. 3 is a block diagram showing outline of the configuration of a sine wave generating apparatus which is the first embodiment according to the present invention. Moreover, FIG. 4 is a flowchart for explaining the operation of the sine wave generating apparatus shown in FIG. 3.

Initially, feature quantity s1 periodically varying is taken in by input means 1 shown in FIG. 3, and is sent to feature quantity detecting means 2. As shown at step S21 of FIG. 4, feature quantity detection is performed. On the basis of the feature quantity s1 delivered to the feature quantity detecting means 2, amplitude, phase and frequency of a sine wave to be generated are calculated. Thus, a signal s2 indicating the amplitude, the phase and the frequency is sent to initialization means 3. At the initialization means 3, first two points of sine wave are calculated by the amplitude, the phase and the frequency which have been designated from the feature quantity detecting means 2. The first two points thus calculated are sent to an oscillator (sine wave generating means) 4 as an initial value (oscillator initialization signal s4 ) along with the designated values so that initial value setting shown at step S22 is performed. The initial value setting is performed by making reference to, e.g., sine wave table. In addition, at this time, variable n indicating position of sample point of output waveform is initialized (n=0).

At step S23, the oscillator (sine wave generating means) 4 generates a sine wave signal in accordance with an initial value designated from the initialization means 3. Such generation of sine wave signal is realized by performing, e.g., IIR filter operation without performing modulo-addressing as described later.

An output signal generated by the oscillator (sine wave generating means) 4 is sent to sine wave storage means 5 as a sine wave signal s5. At step s24, the sine wave storage means 5 stores the sine wave signal s5 from the oscillator (sine wave generating means) 4.

At the subsequent step S25, whether or not the variable n is the number of sample points $N_2$ of output sine wave signal or more is discriminated. When discrimination is made as NO, the variable n is incremented (n=n+1) at step S26 thereafter to return to the step S23 to repeat processing of the steps S23, S24 until n becomes equal to $N_2$ (generated waveform data is collected by a predetermined number of samples $N_2$). When discrimination is made as YES (n has become equal to $N_2$) at step S25, a sine wave signal s6 stored by the sine wave storage means 5 is outputted from output means 6.

Then, an example of sine wave generation in which modulo-addressing by oscillator (sine wave generating means) 4 is not performed will be explained. In the following explanation, value of time point of n (n-th sample) of output sine wave signal is expressed at $y_{[n]}$.

Figure 5:
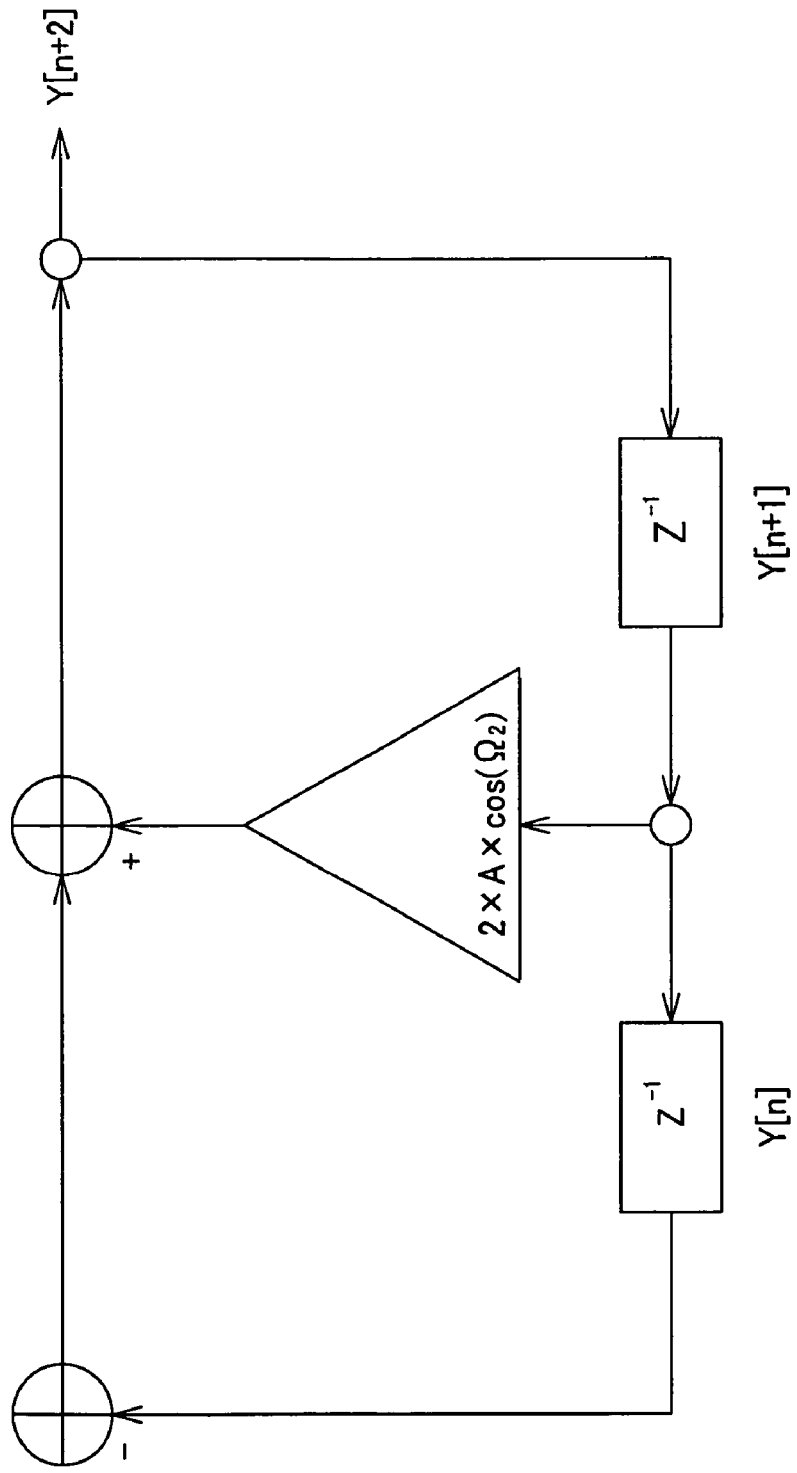
FIG. 5 is a block diagram showing a configuration example of oscillator (sine wave generating means).

FIG. 5 shows a sine wave generating circuit by IIR as a configuration example of the oscillator (sine wave generating means) 4. Namely, when, e.g., secondary IIR filter processing is used, $$y_{[0]} = A\sin(\Phi) \quad (2)$$

$$y_{[1]} = A\sin(\Omega_2 + \Phi) \quad (3)$$

are designated as initial values $y_{[0]}$, $y_{[1]}$ of output sine wave signal. In these formulas (2), (3), $\Phi$ is phase of output sine wave and $\Omega_2$ is frequency of output sine wave, which is given, e.g., every encoding frame period as the feature quantity. Moreover, value $y_{[n+2]}$ of sine wave signal at time point of n+2 is represented by recurrence formula expressed below by using value $y_{[n+1]}$ of sine wave signal at time point of n+1 and value $y_{[n]}$ of sine wave signal at time point of n.

$$y_{[n+2]} = 2 \times A \cos(\Omega_2) \times y_{[n+1]} - y_{[n]} \quad (4)$$

Values of respective sample points of sine wave signal are sequentially calculated by the formula (4). The calculated signal is delivered to sine wave storage means 5 as sine wave signal s5.

The above-mentioned formula (4) is derived as follows. First, z-transformation of sin function is given by the following formula (5).

$$\frac{Y(z)}{X(z)} = \frac{z \times \sin(\omega_2 T)}{z^2 - 2 \times z \cos(\omega_2 T) + 1} \quad (5)$$

When the formula (5) is expanded to perform inverse z-transformation, $$y_{[n+2]} - 2\cos(\omega_2 T) \times y_{[n+1]} + y_{[n]} = 2\sin(\omega_2 T) \times x_{[n]} \quad (6)$$

Here, because there is no input to the IIR filter of FIG. 5, the term of $x_{[n]}$ is equal to 0 (zero) at all times. When this relation is arranged, the above-mentioned formula (4) is derived.

Then, an example of a signal decoder in which sine wave synthesis apparatus as described above is used will be explained. This example of the decoder serves to decode at least a portion of an audio signal by sine wave synthesis, and serves to perform encoding by, e.g., GHA (Generalized Harmonic Analysis) at the encoding side. Explanation will be given below in order of encoder and decoder.

Figure 6:
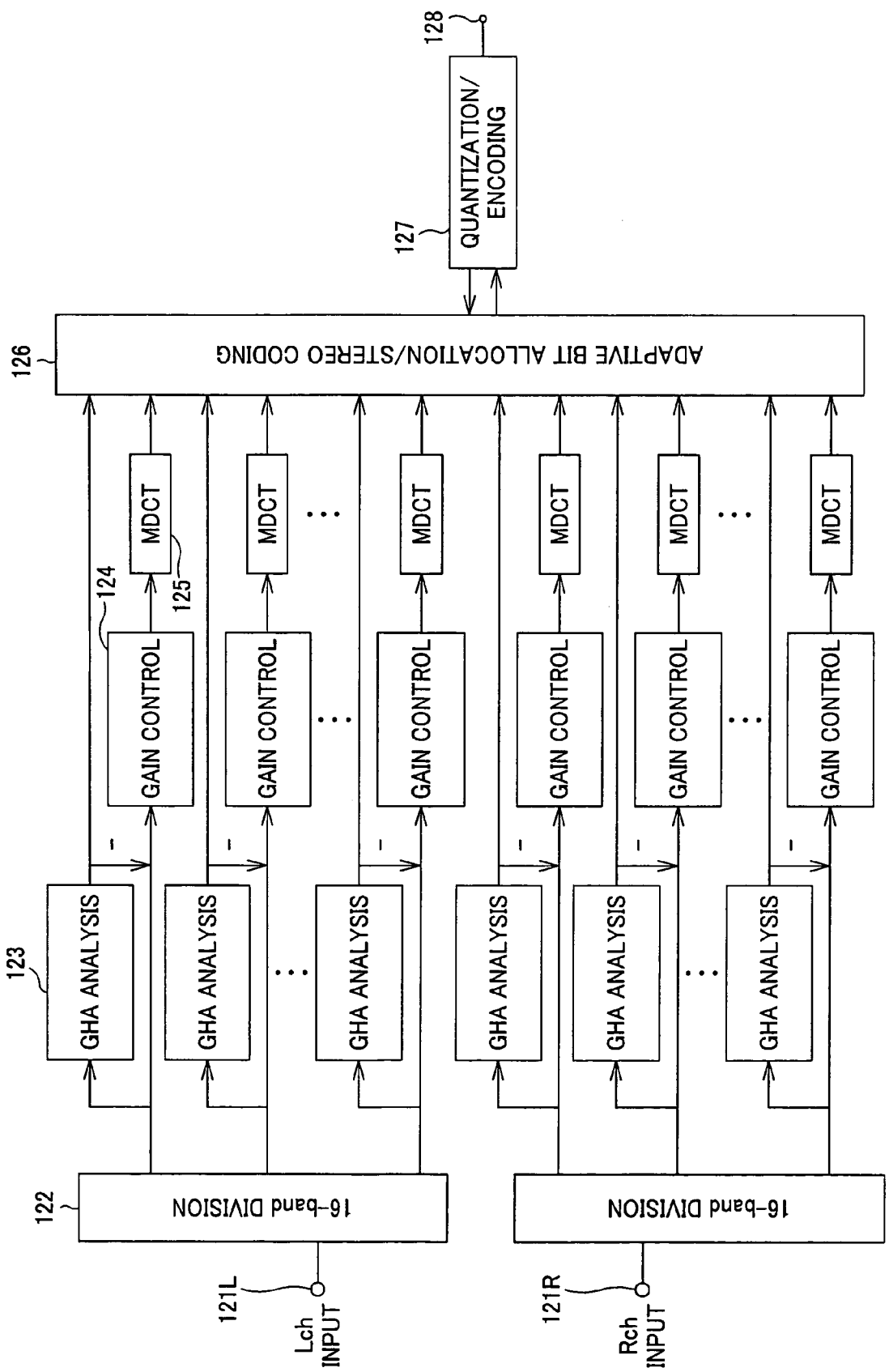
FIG. 6 is a block diagram showing outline of the configuration of an example of an encoder for audio signal (acoustic time series signal).

FIG. 6 is a block diagram showing a configuration example of an encoder for audio signal (acoustic time series signal) using GHA (Generalized Harmonic Analysis). In FIG. 6, signals of left and right channels (Lch, Rch) of stereo (stereophonic) audio signals are respectively inputted to input terminals 121L and 121R. Since the configurations of these left and right channels are the same, explanation will be given in connection with the left channel, and explanation of the right channel will be omitted. Encode processing of audio signal of left (or right) channel delivered to the input terminal 121L (or 121R) is performed every a predetermined encoding frame period (e.g., 2048 samples).

An input signal from the input terminal 121L (or 121R) is sent to, e.g., a 16-band dividing unit 122, at which the input signal is frequency-divided into signal components of 16 bands (frequency bands). Thus, signal components of respective bands (e.g., 128 samples per one band every the encoding frame period) are sent to GHA analysis units 123. The GHA analysis units 123 for respective bands extracts/separates a signal having high periodicity like vowel portion of speech and/or drum, etc. to separately perform encoding operation to send information of feature quantity (e.g., frequency, amplitude, phase, etc.) to an adaptive bit allocation/stereo (stereophonic) coding unit 126. Moreover, the GHA analysis units 123 subtract the signal having high periodicity which has been extracted at the GHA analysis unit 123 for respective bands (frequency bands) from signal components of corresponding bands from the 16-band dividing units 122 to send difference signals thereof to MDCT (Modified Discrete Cosine Transform) units 125 through gain control units 124 to perform MDCT processing thereof. Outputs from the MDCT units 125 for respective bands (MDCT coefficient data) are sent to the adaptive bit allocation/stereo coding unit 126. At the adaptive bit allocation/stereo coding unit 126, stereo coding processing involving adaptive bit allocation is implemented with respect to respective 16 bands of the left and right channels along with feature quantity information from the GHA analysis units 123 for respective bands. An output from the adaptive bit allocation/stereo coding unit 126 is sent to a quantization/encoding unit 127, at which quantization and encoding are implemented. Thus, an encoded output signal (code train) is taken out through an output terminal 128.

Figure 7:
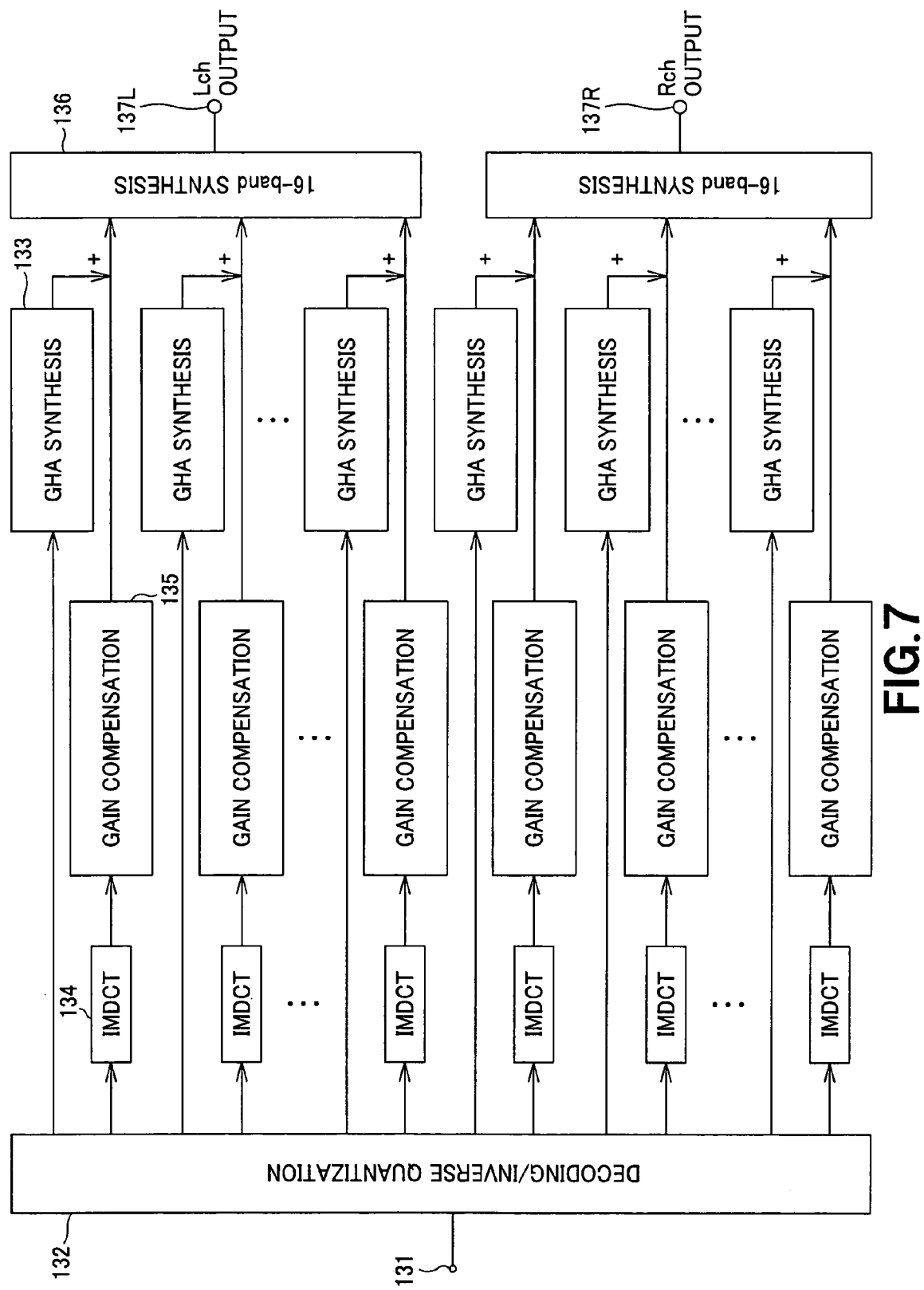
FIG. 7 is a block diagram showing outline of the configuration of an example of a decoder to which embodiment of the present invention is applied.

FIG. 7 is a block diagram showing a configuration example of a decoder adapted for decoding an encoded output signal from the encoder as shown in FIG. 6. An input terminal 131 of FIG. 7 is assumed to be supplied with encoded output signal (code train) from the output terminal 128 of FIG. 6.

A signal from the input terminal 131 of FIG. 7 is sent to a decoding/inverse-quantization unit 132, at which decode processing and inverse-quantization processing which are opposite to the processing at the quantization/encoding unit 127 of FIG. 6 are implemented. The feature quantities and the MDCT coefficients are taken out from the decoding/inverse-quantization unit 132 every respective bands of the above-described stereo left and right channels. The feature quantities sent to GHA synthesis units 133 for respective bands, and the MDCT coefficients are sent to IMDCT (Inverse MDCT) units 134 for respective bands. The GHA synthesis units 133 generate sine waves corresponding to the feature quantities (e.g., frequency, amplitude or phase, etc.). In the case where plural sets of feature quantities are given within corresponding band so that plural sine waves are generated, the GHA synthesis units 133 synthesize these sine waves to output them. The IMDCT units 134 inverse-transform the MDCT coefficients to output signals corresponding to inputs of the MDCT units 125 of FIG. 6 to send the signal thus outputted to gain compensation units 135 to implement processing opposite to that of the gain control units 124 of FIG. 6 to output the signal thus processed. The GHA synthesis units 133 add output (signals corresponding to the difference signals) from the gain compensation units 135 for respective bands and sine wave outputs from the GHA synthesis units 133 for bands to send outputs corresponding 16 bands of added outputs obtained every respective bands to 16-band synthesis units 136 to synthesize outputs thus obtained to thereby take out audio signals of left channel (or right channel) from the output terminal 137L (or 137R).

The waveform generating apparatus and the waveform generating method according to the present invention can be applied to, e.g., GHA synthesis unit 133 of the decoder of FIG. 7. It is to be noted that it is a matter of course that the waveform generating apparatus and the waveform generating method according to the present invention can be applied, in addition to the above, to waveform synthesis units of various decoders involving synthesis of periodical waveform such as sine wave, etc.

Figure 8:
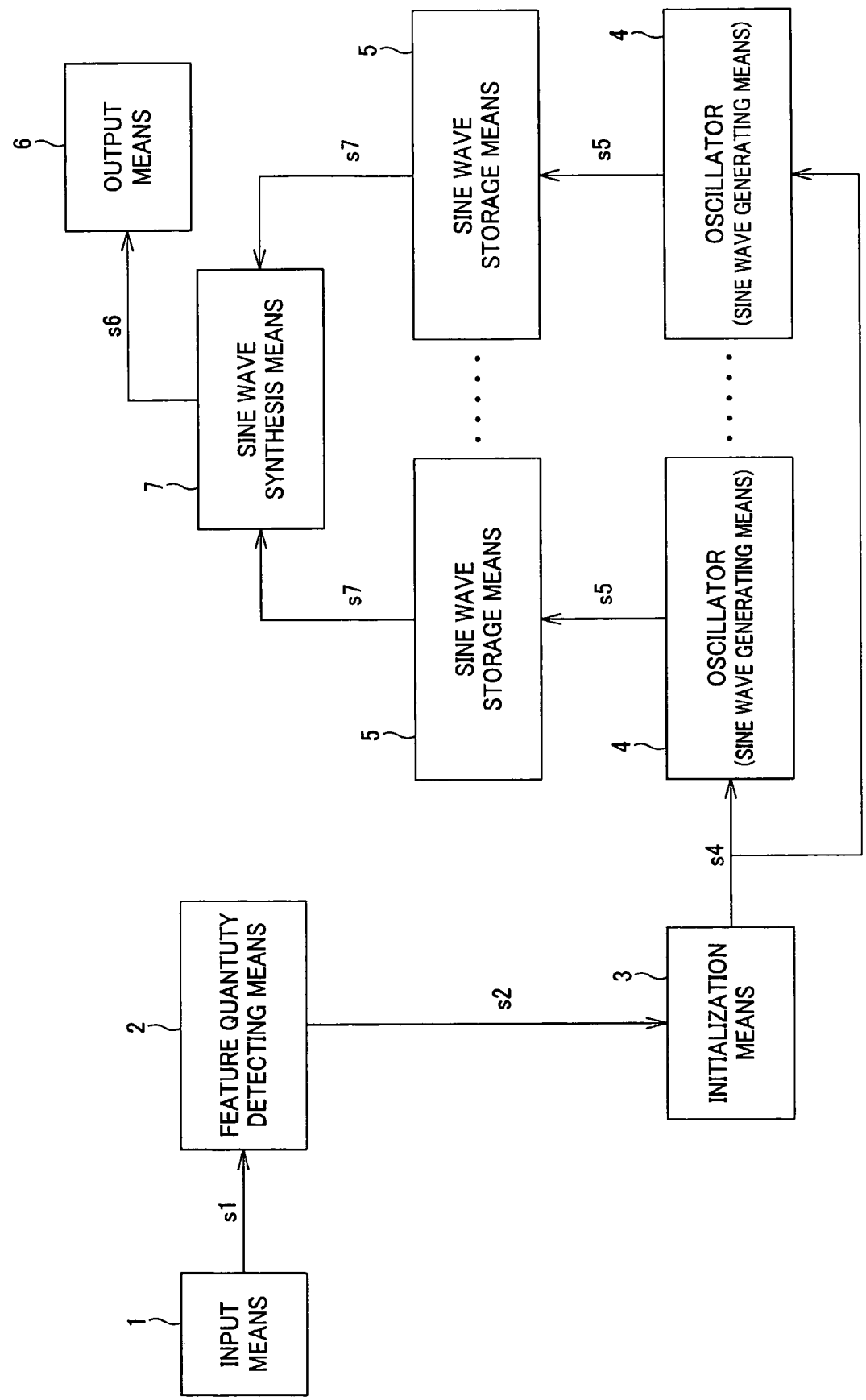
FIG. 8 is a block diagram showing outline of the configuration of a sine wave generating apparatus which is a second embodiment of the present invention.
Figure 9:
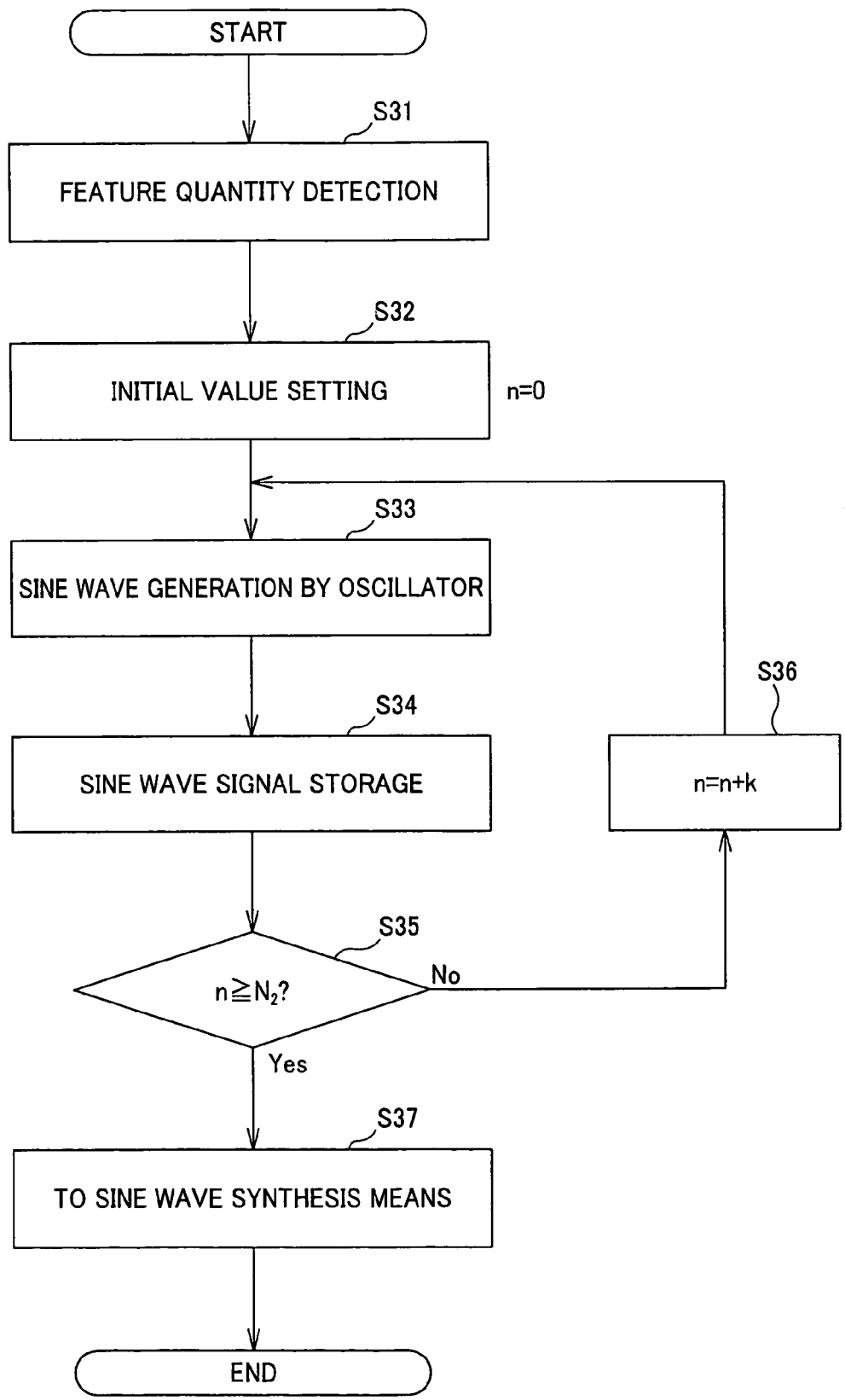
FIG. 9 is a flowchart for explaining the operation of the second embodiment of the present invention.

Then, the second embodiment of the present invention will be explained with reference to FIGS. 8 and 9. FIG. 8 is a block diagram showing outline of the configuration of sine wave generating apparatus which is the second embodiment of the present invention, and FIG. 9 is a flowchart for explaining the operation of the apparatus of FIG. 8. In the second embodiment, plural (e.g., k number of) oscillators (sine wave generating means) are used to perform sine wave generation by parallel processing.

Feature quantity s1 is inputted from input means 1 of FIG. 8, and is delivered to feature quantity detecting means 2, at which feature quantity detection shown at step S31 of FIG. 9 is performed. Amplitude, phase and frequency of a sine wave to be generated are calculated by feature quantity detecting means 2, and the amplitude, the phase and the frequency which have been calculated are delivered as signal s2 to initialization mean 3. The initialization means 3 calculates the first (2×k) points of sine wave by the amplitude, the phase and the frequency which have been designated by the feature quantity detecting means 2 to deliver the points thus calculated to the oscillators as initial value s4 along with the designated values. Here, k is the number of points to be paralleled (step S32).

For example, in the case where processing is performed by two parallel system (k=2), first (2×2)=4 points are referred from the sine wave table.

Then, plural (e.g., k number of) oscillators (sine wave generating means) 4 are oscillated in accordance with the initial value designated by the initialization means 3 to generate a sine wave signal (step S33). Here, respective sample points of time series order of one sine wave signal are sequentially generated from the plural respective oscillators 4.

For example, when secondary IIR filter processing is performed by two parallel system, $$y_{[0]} = A \sin(\Phi) \quad (7)$$

$$y_{[1]} = A \sin(\Omega_2 + \Phi) \quad (8)$$

$$y_{[2]} = A \sin(2 \times \Omega_2 + \Phi) \quad (9)$$

$$y_{[3]} = A \sin(3 \times \Omega_2 + \Phi) \quad (10)$$

are designated as initial values. Sine wave is generated by two parallel system as follows $$y_{[n+4]} = 2 \times A \cos(2 \times \Omega_2) \times y_{[n+2]} - y_{[n]} \quad (11)$$

$$y_{[n+5]} = 2 \times A \cos(2 \times \Omega_2) \times y_{[n+3]} - y_{[n+1]} \quad (12)$$

Here, sine wave to be generated is prepared by nesting system. Particularly, it is not required to perform processing in this way. Theoretically, in the above formula (5), transformation of $z \rightarrow z^2$, $\omega_2 \rightarrow 2 \times \omega_2$ is performed by taking $z = e^{j\omega T}$ into consideration. Thus, z-transformation formula of sin function is given by the following formula (13).

$$\frac{Y(z)}{X(z)} = \frac{z^2 \times \sin(\omega_2 T)}{z^4 - 2 \times z^2 \cos(2 \times \omega_2 T) + 1} \quad (13)$$

When the formula (13) is expanded to perform inverse z-transformation, the following expression is given as follows.

$$y_{[n+4]} - 2 \cos(2\omega_2 T) \times y_{[n+2]} + y_{[n]} = 2 \sin(2\omega_2 T) \times x_{[n+2]} \quad (14)$$

Here, because there is no input, the term of $x_{[n+2]}$ is equal to 0 (zero) at all times. When this relation is arranged, the above-mentioned formula (11) is derived. In addition, when n is incremented by 1 (one), the above-mentioned formula (12) is derived. The calculated signal is delivered to sine wave storage means 5 as sine wave signal s5.

Then, at step S34 of FIG. 9, a sine wave signal s5 designated by the oscillator (sine wave generating means) 4 is stored by sine wave storage means.

At the subsequent step S35, whether or not the variable n becomes equal to the number of samples $N_2$ or more of an output sine wave signal is discriminated. When the discrimination result is NO, n is incremented by k (n=n+k) at step S36 thereafter to return to the step S33 to repeat processing of the steps S33, S34 until n becomes equal to $N_2$ (generated waveform data is collected by a predetermined number of samples $N_2$). When discrimination is made as YES (n has become equal to $N_2$) at step S35, processing proceeds to step S37 to send sine wave signal s7 stored by the sine wave storage means 5 to sine wave synthesis means 7 to synthesize the sine wave signals s7 thus sent into one or plural sine waves. A synthesized sine wave signal s6 is outputted from output means 6.

In the case where, e.g., DSP (Digital Signal Processor) includes plural sum of product operation units, the sine wave generating apparatus as shown in the second embodiment can be easily realized by performing operations of respective oscillators at respective sum of product operation units. Thus, not only processing quantity and/or processing speed can be improved, but also accumulated error resulting from the fact that next sample points are sequentially calculated by the recurrence formula can be also advantageously reduced.

Figure 10:
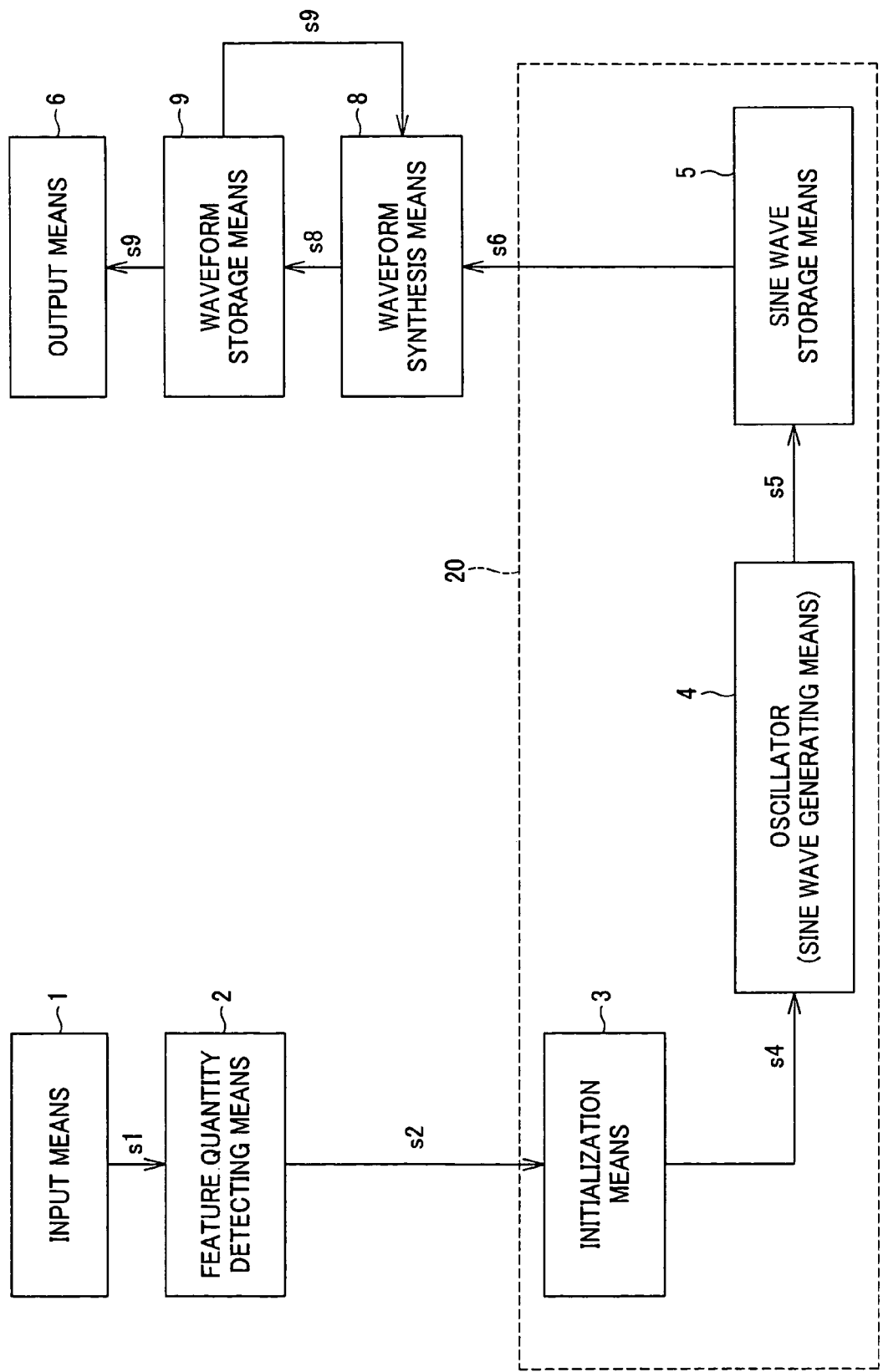
FIG. 10 is a block diagram showing outline of the configuration of a sine wave generating apparatus which is a third embodiment of the present invention.
Figure 11:
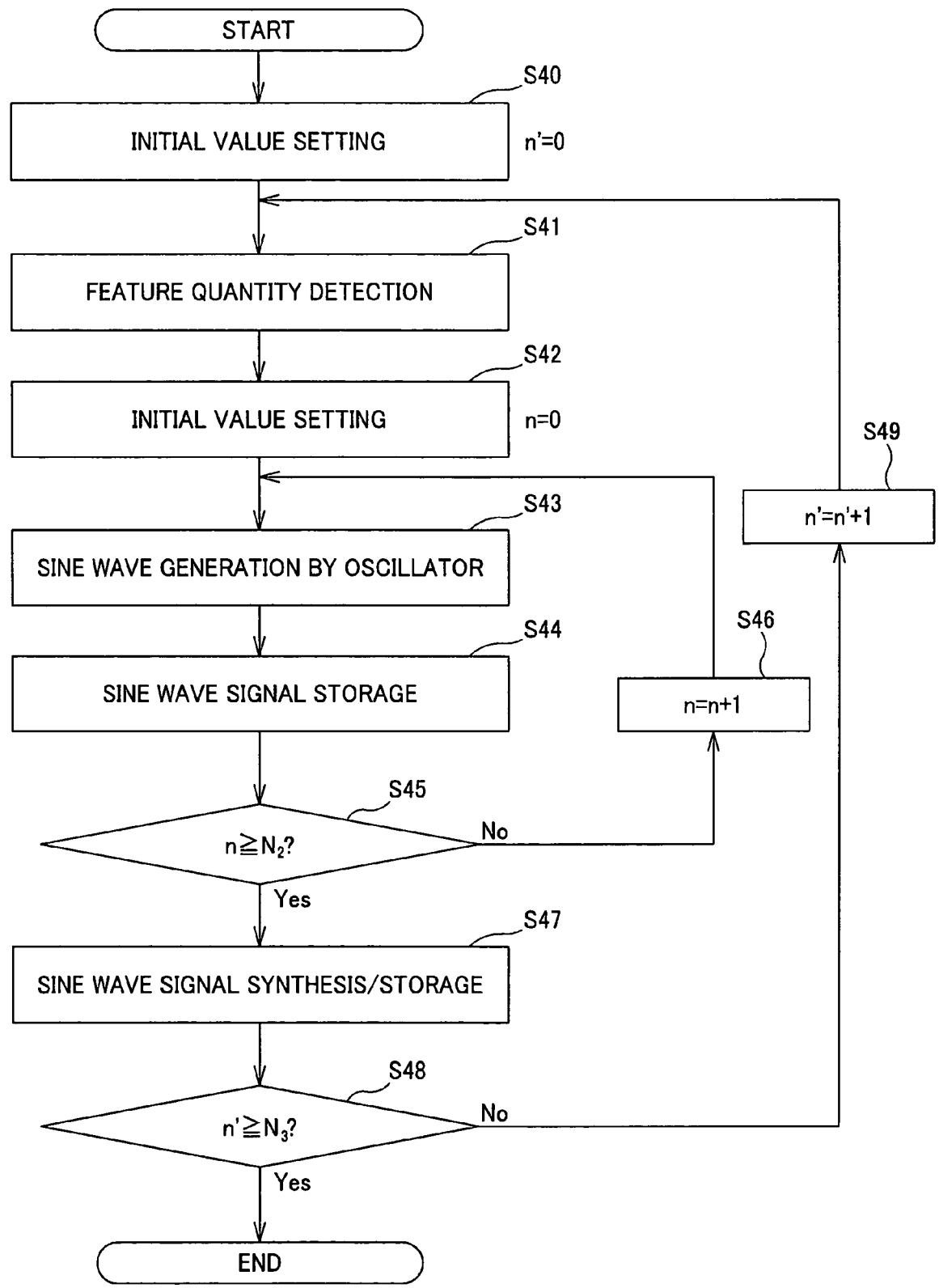
FIG. 11 is a flowchart for explaining the operation of the third embodiment of the present invention.

Then, the third embodiment of the present invention will be explained with reference to FIGS. 10 and 11. FIG. 10 is a block diagram showing outline of the configuration of a sine wave generating apparatus which is the third embodiment of the present invention, and FIG. 11 is a flowchart for explaining the operation of the apparatus of FIG. 10. In the third embodiment, oscillator (sine wave generating means) is used in time divisional manner to generate plural kinds of (plural) sine waves to synthesize them.

In the configuration of FIG. 10, the sine wave generating unit 20 serves to perform operation similar to the above-described sine wave generating apparatus as shown in FIG. 3, and the same reference numerals are respectively attached to corresponding portions.

Feature quantity s1 is inputted from input means 1 of FIG. 10, and is delivered to feature quantity detecting means 2, at which feature quantity detection shown at step S41 of FIG. 11 is performed. Amplitude, phase and frequency of a sine wave to be generated are calculated by the feature quantity detecting means 2. The amplitude, the phase and the frequency which have been calculated are delivered to initialization means 3 of a sine wave generating unit 20 as signal s2. At the sine wave generating unit 20, sine wave signal s5 generated at the oscillator (sine wave generating means) 4 is stored into sine wave storage means 5, and is outputted therefrom as a sine wave signal s6. Since the apparatus of the configuration shown in FIG. 3 (or FIG. 8) can be used as the sine wave generating unit 20, the detailed explanation will be omitted. In addition, the operation up to this step corresponds to step s41 to S46 of FIG. 11. Since this operation is similar to the operation from step S21 to step S26 of FIG. 4, the detailed explanation will be omitted.

Here, in the case of the third embodiment, the number of (the number of kinds of) sine waves to be generated is assumed to be plural ($N_3$). Prior to step S41 for feature quantity detection of FIG. 11, there is provided step s40 for initializing variable n' (n'=0) indicating the number of sine waves to be generated. Moreover, sine wave signal s6 stored in the sine wave storage means 5 of FIG. 10 is sent to waveform synthesis means 8. Thus, an output from the waveform synthesis means 8 is sent to waveform storage means 9, and an output from the waveform storage means 9 is sent to the waveform synthesis means 8. Namely, the waveform synthesis means 8 synthesizes, by a suitable synthesis method, sine wave signal s6 from the sine wave storage means 5 of the sine wave generating unit 20 and storage synthetic wave signal s9 delivered from the waveform storage means 9 to send synthetic wave signal s8 thus obtained to the waveform storage means 9. In the case where, e.g., synthesis is performed without weighting at the waveform synthesis means 8, it is sufficient to determine synthetic waveform output $z_{[k]}$ by the following formula.

$$z_{[k]}=z_{[k]}+y_{[k]}(0 \leq k < N_2)$$

Step S47 of FIG. 11 indicates the operation of waveform synthesis/storage by the waveform synthesis means 8 and the waveform storage means 9.

At the subsequent step S25, whether or not the variable n' becomes equal to the number $N_3$ of the sine waves to be generated or more (n'≧$N_3$) is discriminated. When discrimination is made as NO, the variable n' is incremented (n'=n'+1) at step S49 thereafter to return to the step S41 to repeat processing of the steps S41 to S47 until the variable n' becomes equal to $N_3$ (until sine waves which have been generated are prepared by the number of $N_3$). When discrimination is made as YES (when n' has reached $N_3$) at step S48, synthetic sine wave stored by the sine wave storage means 9 is outputted from output means 6.

Figure 12:
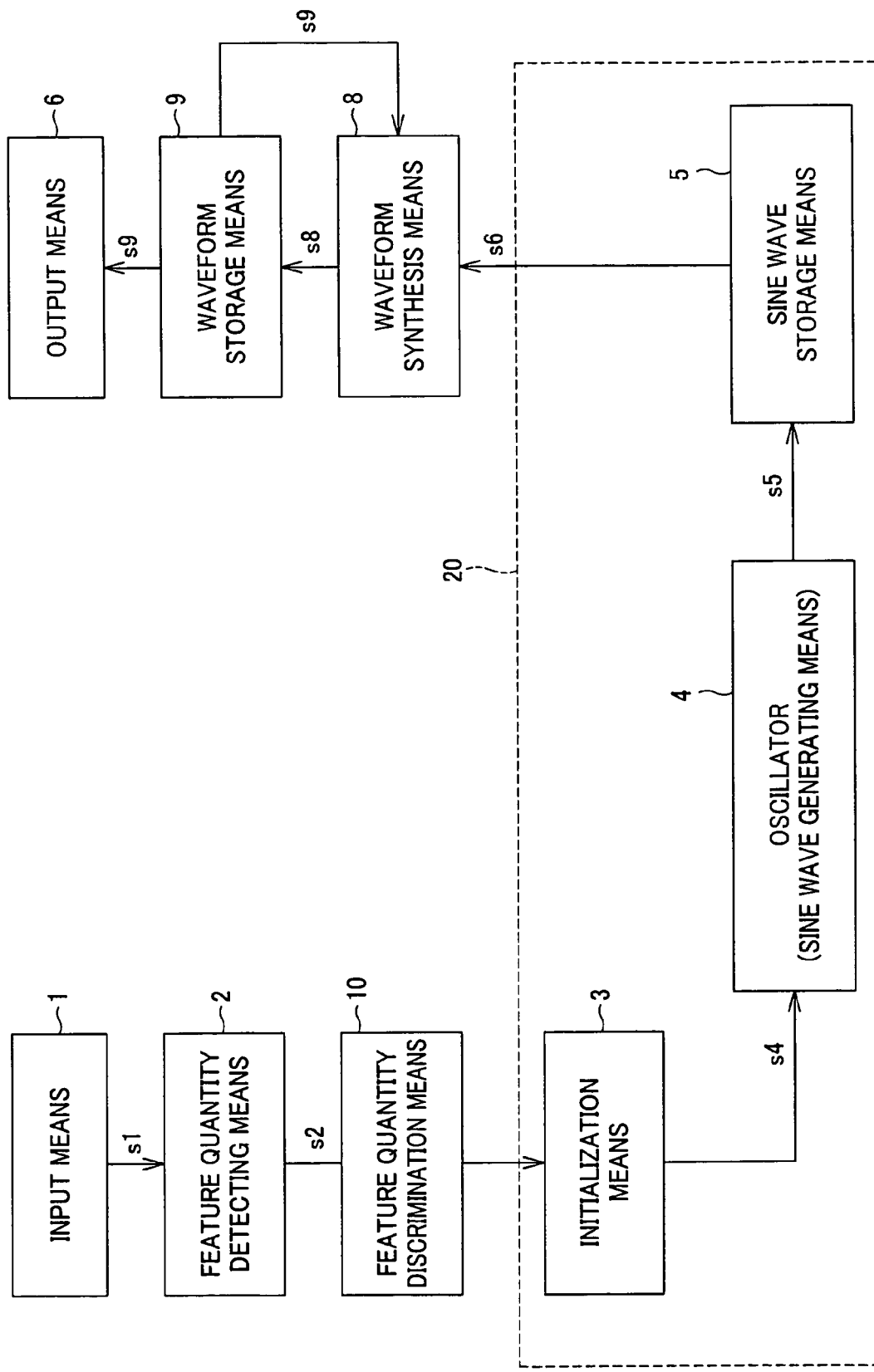
FIG. 12 is a block diagram showing outline of the configuration of a sine wave generating apparatus which is a fourth embodiment of the present invention.
Figure 13:
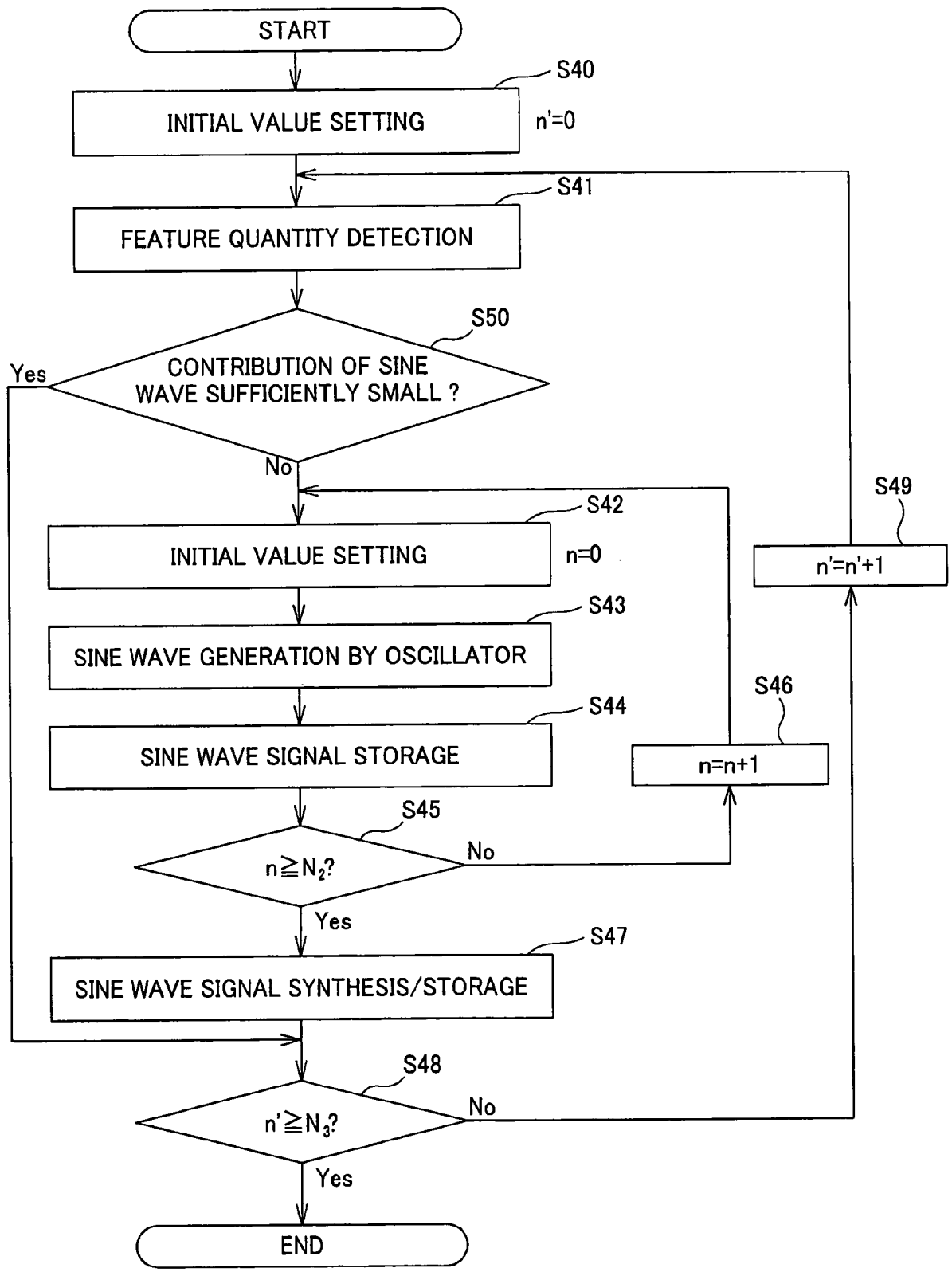
FIG. 13 is a flowchart for explaining the operation of the fourth embodiment of the present invention.

Then, the fourth embodiment of the present invention will be explained with reference to FIGS. 12 and 13. FIG. 12 is a block diagram showing outline of the configuration of a sine wave generating apparatus which is the fourth embodiment of the present invention, and FIG. 13 is a flowchart for explaining the operation of the apparatus of FIG. 12. The fourth embodiment is directed to an embodiment in which the third embodiment which has been explained together with the FIGS. 10 and 11 is changed or modified, wherein in the case where plural kinds of (plural) sine waves are generated to synthesize them, generation/synthesis of sine wave having amplitude sufficiently smaller than amplitude of synthetic waveform is omitted.

Namely, the configuration of FIG. 12 differs from the configuration of FIG. 10 in that feature quantity discrimination means 10 is provided between the feature quantity detecting means 2 and the initialization means 3 of the sine wave generating unit 20, thus to control the operation at the sine wave generating unit 20 in accordance with discrimination result by the feature quantity discrimination means 10. Moreover, the flowchart of FIG. 13 differs from the flowchart of FIG. 9 in that a step s50 of discriminating whether or not contribution of a sine wave to be generated at a current time point is sufficiently small is discriminated is inserted between feature detection of step S41 and initial value setting of step S42, whereby when discrimination result is NO, processing proceeds to step S42, while when discrimination result is YES, processing jumps to step S48. Other portions of FIGS. 12 and 13 are similar to those of the FIGS. 10 and 11, and the same reference numerals are respectively attached to corresponding portions and their explanation will be omitted.

In the fourth embodiment of such configuration, in the case where plural sine waves are generated to synthesize them, the feature quantity discrimination means 10 of FIG. 12 serves to analyze signal s2 of amplitude, phase and frequency information with respect to one sine wave from the feature quantity detecting means 2 based on feature quantity to discriminate whether or not the sine wave is generated/synthesized as shown at step S50 of FIG. 13 to send a signal s2' to the initialization means 3 of the sine wave generating unit 20. The reason thereof is as follows. In the case where the sine wave has sufficiently small contribution to final synthetic wave obtained by synthesis, e.g., in the case where amplitude of corresponding sine wave is sufficiently smaller than amplitude of synthetic wave, generation/synthesis of the corresponding sine wave is not performed. At this time, it is mentioned that the feature quantity discrimination means 10 may perform a control so as not to send the signal s2 from the feature quantity detecting means 2 to the initialization means 3 of the sine wave generating unit 20, or so as to stop sine wave generating operation at the sine wave generating unit 20. In FIG. 13, when discrimination is made as YES (the sine wave is not generated/synthesized) at step S50, processing jumps sine wave generating operation from steps S42 to S47 to proceed to step S48.

In accordance with such fourth embodiment, since unnecessary processing can be omitted, margin takes place in processing ability. Thus, it becomes possible to realize improvement in speed and/or distribution of processing power to other portions, etc.

Meanwhile, in the above-described embodiments, there may be used arbitrary oscillator (sine wave generating means) 4 such that sufficient accuracy can be guaranteed for a time period during which a predetermined length (number of samples) $N_2$ is outputted. When sine wave having 1 (one) kHz is determined by using secondary IIR filter processing as shown in the above-mentioned FIG. 5 under the condition where, e.g., length is 128 points, the amplitude is 1 (one) and the initial phase is 0 (zero), initial values are respectively given as follows.

$$y_{[0]}=\sin(0)$$

$$y_{[1]}=\sin(2\pi/128)$$

Thus, the sine wave to be determined can be determined as follows.

$$y_{[n+2]}=2\cos(2\pi/128) \times y_{[n+1]}-y_{[n]}$$

Figure 14:
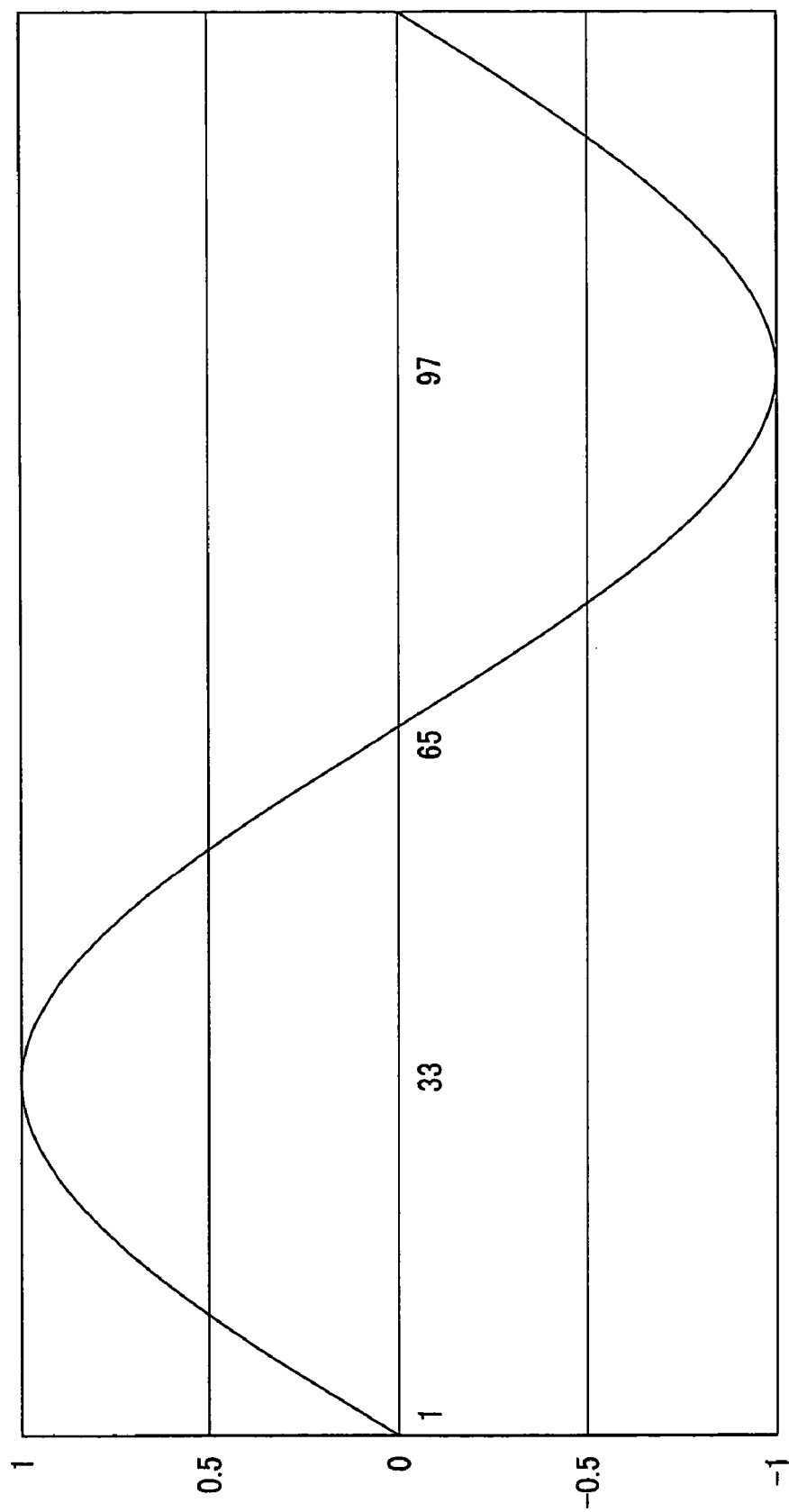
FIG. 14 is a view showing sine wave generated by oscillator (sine wave generating means).

The sine wave determined by this method is shown in FIG. 14. It is to be noted that sine wave calculated in accordance with table reference, etc. by using sin function is also indicated in a manner substantially overlapping with the sine wave curve of FIG. 14. Therefore, sine wave determined by using the practically sufficient secondary IIR filter processing can be obtained with practically sufficient accuracy.

It is to be noted that the present invention is not limited to the above-described embodiments, and the present invention can be easily applied also to, e.g., generation of various periodical waveforms except for sine wave.

It is to be noted that while the invention has been described in accordance with preferred embodiments thereof illustrated in the accompanying drawings and described in detail, it should be understood by those ordinarily skilled in the art that the invention is not limited to embodiments, but various modifications, alternative constructions or equivalents can be implemented without departing from the scope and spirit of the present invention as set forth by appended claims.

INDUSTRIAL APPLICABILITY

In accordance with the present invention, in generating periodical waveform on the basis of inputted feature quantity, the inputted feature quantity is detected to compute recurrence formula with at least two sample points being as initial value on the basis of the detected feature quantity to thereby generate the periodical waveform to output the generated periodical waveform, thereby making it possible to smoothly generate periodical waveforms such as sine wave, etc. without performing modulo-addressing.

In addition, in accordance with the present invention, in decoder supplied with encoded data including feature quantity obtained by performing sine wave analysis of time series signal every encoding frame, there is included waveform synthesis unit comprising separating means for separating feature quantity in the encoded data, detecting means for detecting the separated feature quantity, oscillating means for computing recurrence formula with at least two sample points being as initial point on the basis of the feature quantity detected by the detecting means to thereby generate the periodical waveform, and output means for outputting the periodical waveform generated from the oscillating means. Thus, even if there is restriction in ability of DSP, etc. for realizing decoder, particularly even if modulo-addressing ability is low, generation of periodical waveform such as sine wave, etc. can be smoothly performed. For this reason, in the apparatus poor or weak in modulo-addressing, generation of sine wave can be realized without performing modulo-addressing. As a result, DSP suitable for realization of function of the entirety of the decoder can be employed. Thus, degree of freedom of design is enhanced.

The invention claimed is:

1. A waveform generating apparatus adapted for generating a periodical waveform on the basis of an inputted feature quantity,
the waveform generating apparatus including:
detecting means for detecting the inputted feature quantity;
oscillating means for computing at least two values of the periodical waveform at sample points on the basis of the feature quantity detected by the detecting means, and assigning the at least two values as initial values to terms of a trinomial recurrence formula to thereby generate the periodical waveform based on the trinomial recurrence formula; and
output means for outputting the periodical waveform generated from the oscillating means.

2. The waveform generating apparatus as set forth in claim 1,
wherein the periodical waveform is a sine wave, whereby in the case where value of a sine wave signal at an arbitrary time point of n is $y_{[n]}$, when phase $\Phi$ and frequency $\Omega_2$ of the sine wave to be outputted are given as the feature quantity, $$y_{[0]} = A \sin(\Phi)$$

$$y_{[1]} = A \sin(\Omega_2 + \Phi)$$

are used as initial values $y_{[0]}$, $y_{[1]}$, and a formula expressed below in which value $y_{[n+2]}$ of a sine wave signal at a time point of n+2 is represented by value $y_{[n+1]}$ of a sine wave signal at a time point of n+1 and value $y_{[n]}$ of a sine wave signal at a time point of n, $$y_{[n+2]} = 2 \times A \cos(\Omega_2) \times y_{[n+1]} - y_{[n]}$$

is used as the trinomial recurrence formula.

3. The waveform generating apparatus used for sine wave synthesis of a decoder supplied with encoded data including feature quantity obtained by performing periodical waveform analysis of a time series signal every encoding frame, the waveform generating apparatus as set forth in claim 1, wherein the feature quantity is periodically given every encoding frame, and the periodical waveform from the oscillating means is stored into storage means by the one frame to output the stored periodical waveform through the output means.

4. The waveform generating apparatus as set forth in claim 1, wherein plural oscillating means are used as the oscillating means to sequentially generate respective sample points of time series order of the periodical waveform by the plural oscillating means.

5. The waveform generating apparatus as set forth in claim 1, wherein plural feature quantities corresponding to plural waveforms are given as the feature quantity to generate signals of periodical waveforms every respective feature quantities to output a signal obtained by adding those signals.

6. The waveform generating apparatus as set forth in claim 1, wherein generation and/or addition of a wave or waves in which it is judged that contribution to final output waveform is small of the plural feature quantities is or are not performed.

7. The waveform generating apparatus in claim 1, wherein the feature quantity is information of at least an amplitude and a phase of the sine wave.

8. The waveform generating apparatus in claim 7, wherein the feature quantity further includes information of a frequency of the sine wave.

9. A waveform generation method of generating a periodical waveform on the basis of an inputted feature quantity, the waveform generation method including: a detection step of detecting the inputted feature quantity; a waveform generation step of computing at least two values of the periodical waveform at sample points on the basis of the feature quantity detected by the detecting means, and assigning the at least two values as initial values to terms of a trinomial recurrence formula to thereby generate the periodical waveform based on the trinomial recurrence formula; and an output step of outputting the periodical waveform generated by the waveform generation step.

10. The waveform generation method as set forth in claim 9, wherein the periodical waveform is a sine wave, whereby in the case where value of a sine wave signal at an arbitrary time point of n is $y_{[n]}$, when phase $\Phi$ and frequency $\Omega_2$ of the sine wave to be outputted are given as the feature quantity, $$y_{[0]} = A \sin(\Phi)$$

$$y_{[1]} = A \sin(\Omega_2 + \Phi)$$

are used as initial values $y_{[0]}$, $y_{[1]}$, and a formula expressed below in which value $y_{[n+2]}$ of a sine wave signal at a time point of n+2 is represented by value $y_{[n+1]}$ of a sine wave signal at a time point of n+1 and $y_{[n]}$ of a sine wave signal at a time point of n $$y_{[n+2]} = 2 \times A \cos(\Omega_2) \times y_{[n+1]} - y_{[n]}$$

is used as the recurrence formula.

11. The waveform generation method used for sine wave synthesis of a decoder supplied with encoded data including feature quantity obtained by performing periodical waveform analysis of a time series signal every encoding frame, the waveform generation method as set forth in claim 9, wherein the feature quantity is periodically given every encoding frame to store a periodical waveform from a waveform generation step by the 1 (one) frame to output the stored periodical waveform.

12. The waveform generating apparatus in claim 9, wherein the feature quantity is information of an amplitude, a phase and a frequency of the sine wave.

13. The waveform generation method in claim 12, wherein the feature quantity further includes information of a frequency of the sine wave.

14. A decoder supplied with encoded data including feature quantity obtained by performing sine wave analysis of a time series signal every encoding frame, the decoder including a waveform synthesis unit comprising: separating means for separating feature quantity in the encoded data; detecting means for detecting the separated feature quantity; oscillating means for computing at least two values of periodical waveform at sample points on the basis of the feature quantity detected by the detecting means, and assigning the at least two values as initial values to terms of a trinomial recurrence formula to generate a periodical waveform based on the trinomial recurrence formula; and output means for outputting the periodical waveform generated from the oscillating means.

15. The decoder as set forth in claim 14, wherein the periodical waveform is a sine wave, whereby in the case where value of a sine wave signal at an arbitrary time point of n is $y_{[n]}$, when phase $\Phi$ and frequency $\Omega_2$ of the sine wave to be outputted are given as the feature quantity, $$y_{[0]} = A \sin(\Phi)$$

$$y_{[1]} = A \sin(\Omega_2 + \Phi)$$

are used as initial values $y_{[0]}$, $y_{[1]}$, and a formula in which value $y_{[n+2]}$ of a sine wave signal at a time point of n+2 is represented by value $y_{[n+1]}$ of a sine signal at a time point of n+1 and value $y_{[n]}$ of a sine wave signal at a time point of n $$y_{[n+2]} = 2 \times A \cos(\Omega_2) \times y_{[n+1]} - y_{[n]}$$

is used as the recurrence formula.

16. The waveform generating apparatus in claim 14, wherein the feature quantity is information of an amplitude, a phase and a frequency of the sine wave.

17. The waveform generating apparatus in claim 16, wherein the feature quantity further includes information of a frequency of the sine wave.

* * * * *